(12) United States Patent
Sato

(10) Patent No.: US 7,176,688 B2
(45) Date of Patent: Feb. 13, 2007

(54) RF COIL AND MRI APPARATUS

(75) Inventor: Kenji Sato, Tokyo (JP)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 0 days.

(21) Appl. No.: 10/968,545

(22) Filed: Oct. 19, 2004

(65) Prior Publication Data

US 2005/0088179 A1    Apr. 28, 2005

(30) Foreign Application Priority Data

Oct. 22, 2003    (JP)    ............... 2003-361472

(51) Int. Cl.
  *G01V 3/00*    (2006.01)
(52) U.S. Cl. ..................... 324/318; 324/322
(58) Field of Classification Search ................ 324/318, 324/319, 322, 309, 307, 300; 600/410, 422
See application file for complete search history.

(56) References Cited

U.S. PATENT DOCUMENTS

| 4,636,730 A | 1/1987 | Bottomley |
| 4,981,838 A | 1/1991 | Whitehead |
| 5,270,653 A * | 12/1993 | Pauly ............... 324/309 |
| 5,276,398 A | 1/1994 | Withers et al. |
| 5,565,778 A | 10/1996 | Brey et al. |
| 5,933,007 A | 8/1999 | Schommer et al. |
| 5,945,826 A | 8/1999 | Leussler |
| 6,043,658 A | 3/2000 | Leussler |

FOREIGN PATENT DOCUMENTS

JP    2003-038459    2/2003

OTHER PUBLICATIONS

Primdahl et al: Compect Spherical Coil; J. Phys. E. Sci. Instrum. vol. 15, 221-225 (1982).*

* cited by examiner

*Primary Examiner*—Brij B. Shrivastav
(74) *Attorney, Agent, or Firm*—Carl B. Horton, Esq.; Armstrong Teasdale LLP

(57) ABSTRACT

An RF coil includes a plurality of concentric loops lying at different positions along a coil axis, whose sensitivity is improved in a central portion, and a plurality of loops are constructed as circular loops whose circles correspond to those formed by cutting a sphere common to the loops vertically with respect to the coil axis at different positions along the coil axis. Each of the plurality of loops constitutes a solenoid coil. Alternatively, a helical coil uninterruptedly running around the coil axis is formed.

20 Claims, 12 Drawing Sheets

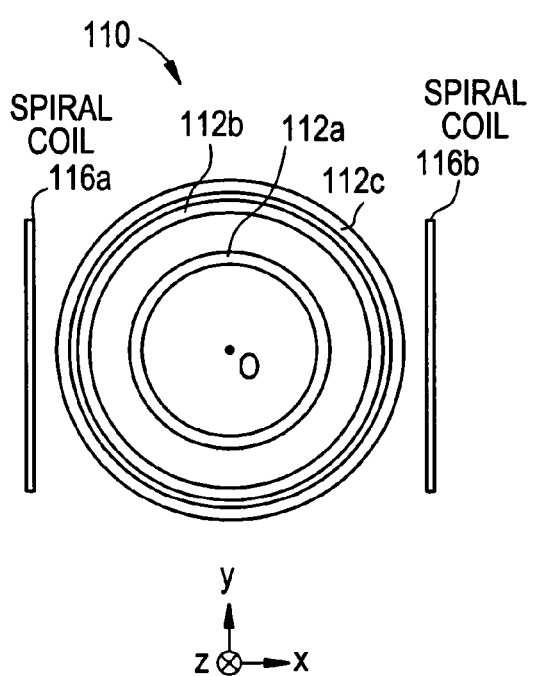 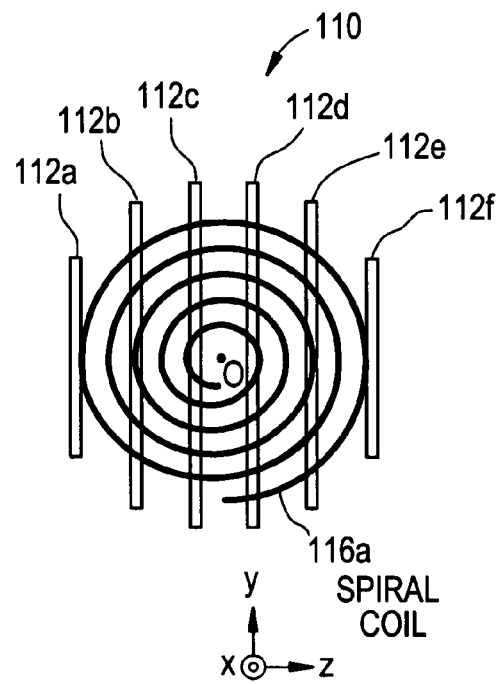

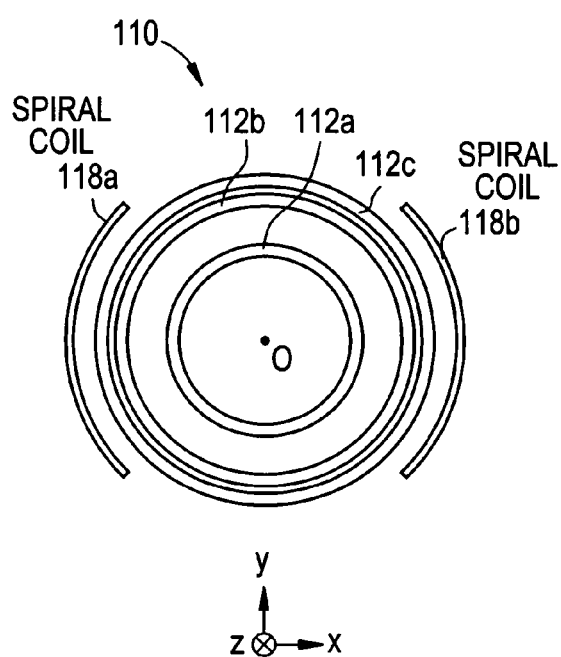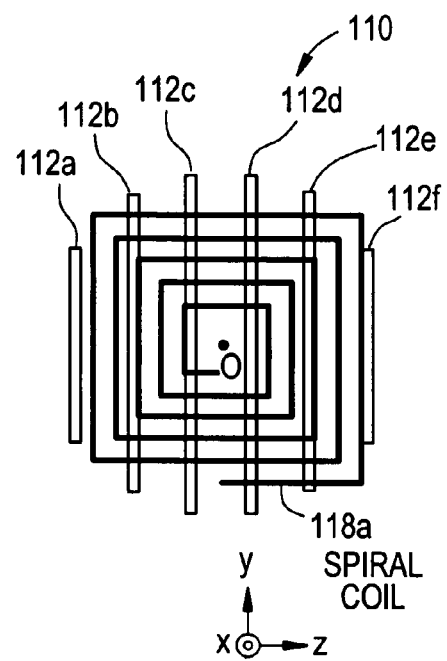

$$H = \frac{NI}{3r}$$

RF COIL AND MRI APPARATUS

CROSS REFERENCE TO RELATED APPLICATIONS

This application claims the benefit of Japanese Application No. 2003-361472 filed Oct. 22, 2003.

BACKGROUND OF THE INVENTION

The present invention relates to an RF (radio frequency) coil and an MRI (magnetic resonance imaging) apparatus, and particularly to an RF coil comprising a plurality of concentric loops lying at different positions along a coil axis, and an MRI apparatus comprising such an RF coil.

An RF coil is used for transmission, reception or both of RF signals in an MRI apparatus. One conventionally employed form of the RF coil is one comprising a plurality of concentric loops lying at different positions along a coil axis (for example, see Patent Document 1).

[Patent Document 1] Japanese Patent Application Laid Open No. 2003-38459 (Page 5, FIG. 1).

The RF coil with such a configuration in which a plurality of loops are simultaneously used has reduced combined sensitivity in the middle between adjacent loops. If an imaging center lies at such a position, the resulting image has a poor SNR (signal-to-noise ratio) in the central portion.

SUMMARY OF THE INVENTION

It is therefore an object of the present invention to provide an RF coil comprising a plurality of concentric loops lying at different positions along the coil axis, whose sensitivity is improved in the central portion. Moreover, another object is to provide a spiral RF coil by which a steep rise in sensitivity at a coil position is mitigated. Furthermore, still another object is to provide an MRI apparatus comprising such an RF coil.

(1) The present invention, in one aspect thereof for solving the aforementioned problems, is an RF coil characterized in comprising: a plurality of concentric loops lying at different positions along the coil axis at regular intervals, wherein said loops are circular loops whose circles correspond to those formed by cutting a sphere common to said loops vertically with respect to the coil axis at the different positions along the coil axis.

Preferably, each of said loops forms a solenoid coil so that the structure is simplified. Preferably, said loops together form a helical coil uninterruptedly running around the coil axis so that homogeneity of the sensitivity distribution is improved.

Preferably, said coil axis comprises two orthogonal axes intersecting at the center of the common sphere, and said plurality of loops comprises two sets of loops disposed one along each axis, so that a quadrature operation is enabled.

Preferably, one of said two sets has said plurality of loops individually forming solenoid coils, and the other has said plurality of loops forming a helical coil uninterruptedly running around the coil axis so that advantages of the both are exploited.

Preferably, said RF coil comprises a spiral coil having a coil axis orthogonally intersecting said coil axis at the center of said common sphere, and disposed outside said plurality of loops so that sensitivity in the central portion is further improved.

(2) The present invention, in another aspect thereof for solving the aforementioned problems, is an RF coil characterized in comprising: a plurality of concentric loops lying at different positions along the coil axis; and a spiral coil having a coil axis orthogonally intersecting said coil axis at the center thereof, and disposed outside said plurality of loops.

Preferably, said plurality of loops has an internal space for accommodating the head of a medical patient so that head imaging is enabled. Preferably, said spiral coil has an auxiliary spiral coil having an inverse electromagnetic effect so that a steep rise in sensitivity at a coil position is mitigated. Preferably, said spiral coil is comprised of a pair of coils having a common coil axis and disposed to face each other so that sensitivity in the central portion is further improved.

(3) The present invention, in still another aspect thereof for solving the aforementioned problems, is an RF coil characterized in comprising: a pair of spiral coils having a common coil axis and disposed to face each other; and a pair of auxiliary spiral coils attached to said pair of spiral coils, and having an inverse electromagnetic effect.

Preferably, said pair of spiral coils form a phased array coil so that an independent operation is enabled. Preferably, said pair of spiral coils form a saddle coil to have good compatibility with the plurality of loops.

Preferably, said auxiliary coils have the direction of their spirals inverted with respect to said spiral coils so that the electromagnetic effect is inverted. Preferably, said auxiliary coils have a smaller area than that of said spiral coils so that the RF coil can be made smaller in size. Preferably, said auxiliary coils have a smaller number of turns than that of said spiral coils so that the amount of material can be saved.

(4) The present invention, in still another aspect thereof for solving the aforementioned problems, is an MRI apparatus for applying a static magnetic field, a gradient magnetic field and a high frequency magnetic field by a magnet system, receiving magnetic resonance signals generated thereby within a subject by an RF coil, and reconstructing an image based on the received signals, characterized in that: said RF coil is an RF coil as defined by any one of claims 1–16.

In the present invention of the aspect set forth above in (1), since the plurality of loops are circular loops whose circles correspond to those formed by cutting a sphere common to the loops vertically with respect to the coil axis at the different positions along the coil axis, there is provided an RF coil whose sensitivity is improved in the central portion.

In the present invention of the aspect set forth above in (2), since the RF coil comprises a plurality of concentric loops lying at different positions along a coil axis, and a spiral coil having a coil axis orthogonally intersecting the coil axis at a center thereof, and disposed outside the plurality of loops, there is provided an RF coil whose sensitivity is improved in the central portion.

In the present invention of the aspect set forth above in (3), since the RF coil comprises a pair of spiral coils having a common coil axis and disposed to face each other, and a pair of auxiliary spiral coils attached to the pair of spiral coils, and having an inverse electromagnetic effect, there is provided a spiral RF coil by which a steep rise in sensitivity at a coil position is mitigated.

In the present invention of the aspect set forth above in (4), there is provided an MRI apparatus comprising an RF coil having the aforementioned characteristics.

Further objects and advantages of the present invention will be apparent from the following description of the preferred embodiments of the invention as illustrated in the accompanying drawings.

BRIEF DESCRIPTION OF THE DRAWINGS

FIG. 6 is a diagram schematically showing the configuration of the receive coil section.

FIG. 8 is a diagram schematically showing the configuration of the receive coil section.

DETAILED DESCRIPTION OF THE INVENTION

Figure 1:
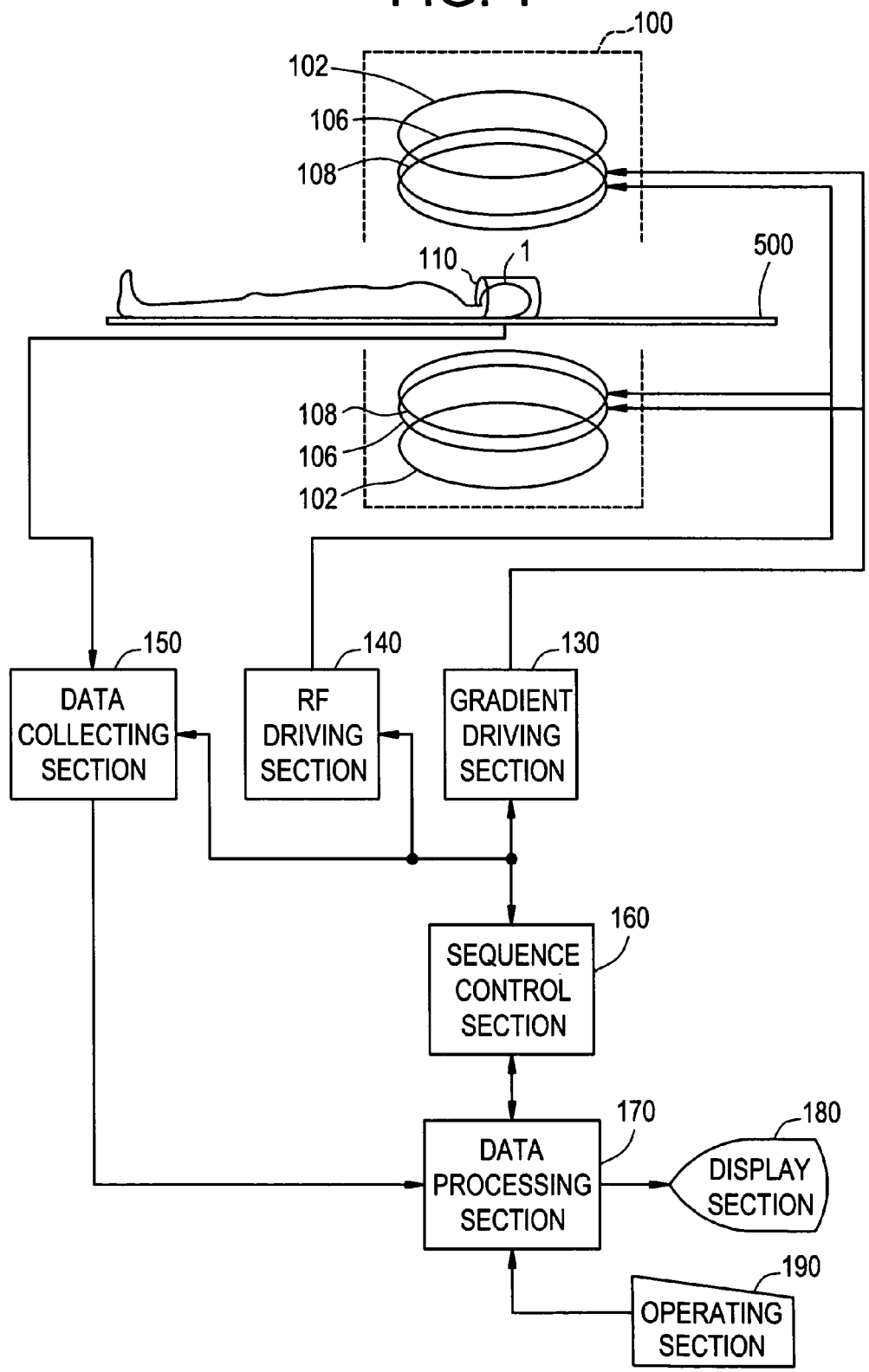
FIG. 1 is a block diagram of an MRI apparatus.

The best mode for carrying out the invention will now be described in detail with reference to the accompanying drawings. It should be noted that the present invention is not limited to the best mode for carrying out the invention. FIG. 1 shows a block diagram of an MRI apparatus. The apparatus is an example in the best mode for carrying out the present invention. The configuration of the apparatus represents an example of the MRI apparatus in the best mode for carrying out the present invention.

As shown in FIG. 1, the present apparatus has a magnet system 100. The magnet system 100 has a main magnetic field magnet section 102, a gradient coil section 106, and a transmit coil section 108. The main magnetic field magnet section 102 and the coil sections are each comprised of a pair of members facing each other across a space. These sections have a generally disk-like shape and are disposed to have a common center axis. A subject to be imaged 1 is rested on a cradle 500 and carried into and out of an internal space of the magnet system 100. The subject 1 is fitted with a receive coil section 110 over his head.

The main magnetic field magnet section 102 generates a static magnetic field in the internal space of the magnet system 100. The direction of the static magnetic field is generally orthogonal to the direction of the body axis of the subject 1. That is, a magnetic field commonly referred to as a vertical magnetic field is generated. The main magnetic field magnet section 102 is made using a permanent magnet, for example. However, the main magnetic field magnet section 102 is not limited to a permanent magnet, and may be made using a super or normal conductive electromagnet or the like.

The gradient coil section 106 generates three gradient magnetic fields for imparting gradients to the static magnetic field strength in directions of three mutually perpendicular axes, i.e., a slice axis, a phase axis, and a frequency axis.

Representing mutually perpendicular coordinate axes in the static magnetic field space as x, y, and z, any one of the axes may be the slice axis. In this case, one of the two remaining axes is the phase axis and the other is the frequency axis. In the present apparatus, the direction of the body axis of the subject 1 is defined as the z-axis direction. In order to enable generation of such gradient magnetic fields, the gradient coil section 106 has three gradient coils, which are not shown.

The transmit coil section 108 generates an RF magnetic field in the static magnetic field space for exciting spins within the subject 1. The generation of the RF magnetic field will be sometimes referred to as transmission of an RF excitation signal hereinbelow. Moreover, the RF excitation signal will be sometimes referred to as the RF pulse. Electromagnetic waves, i.e., magnetic resonance signals, generated by the excited spins are received by the receive coil section 110.

The magnetic resonance signals are those in a frequency domain, i.e., in a Fourier space. Since the magnetic resonance signals are encoded in two axes by the gradients in the phase- and frequency-axis directions, the magnetic resonance signals are obtained as signals in a two-dimensional Fourier space. The phase encoding gradient and readout gradient determine a position at which a signal is sampled in the two-dimensional Fourier space. The two-dimensional Fourier space is sometimes referred to as the k-space.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106.

The transmit coil section 108 is connected with an RF driving section 140. The RF driving section 140 supplies driving signals to the transmit coil section 108 to transmit an RF pulse, thereby exciting the spins within the subject 1. The receive coil section 110 is connected with a data collecting section 150. The data collecting section 150 collects signals received by the receive coil section 110 as digital data.

The gradient driving section 130, RF driving section 140 and data collecting section 150 are connected with a sequence control section 160. The sequence control section 160 controls the gradient driving section 130, RF driving section 140 and data collecting section 150 to carry out the collection of magnetic resonance signals.

The sequence control section 160 is, for example, constituted using a computer. The sequence control section 160 has a memory, which is not shown. The memory stores programs for the sequence control section 160 and several kinds of data. The function of the sequence control section 160 is implemented by the computer executing a program stored in the memory.

The output of the data collecting section 150 is connected to a data processing section 170. Data collected by the data collecting section 150 are input to the data processing section 170. The data processing section 170 is, for example, constituted using a computer. The data processing section 170 has a memory, which is not shown. The memory stores programs for the data processing section 170 and several kinds of data.

The data processing section 170 is connected to the sequence control section 160. The data processing section 170 is above the sequence control section 160 and controls it. The function of the present apparatus is implemented by the data processing section 170 executing a program stored in the memory.

The data processing section 170 stores the data collected by the data collecting section 150 into the memory. A data space is established in the memory. The data space corresponds to the k-space. The data processing section 170 performs two-dimensional inverse Fourier transformation on the data in the k-space to reconstruct an image.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image output from the data processing section 170 and several kinds of information. The operating section 190 is operated by a user to input several commands, information and so forth to the data processing section 170. The user interactively operates the present apparatus via the display section 180 and operating section 190.

Figure 2A:
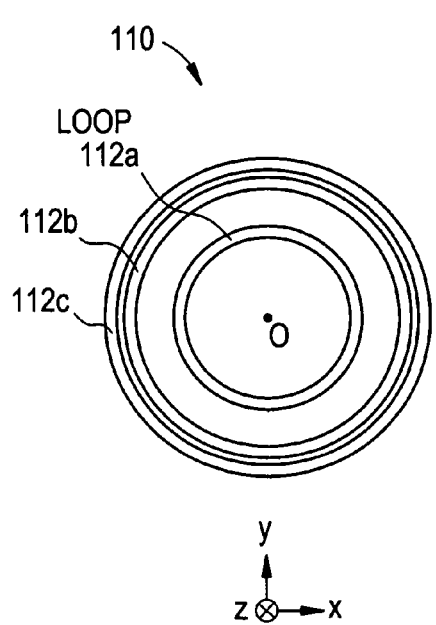
FIG. 2 is a diagram schematically showing the configuration of a receive coil section.
Figure 2B:
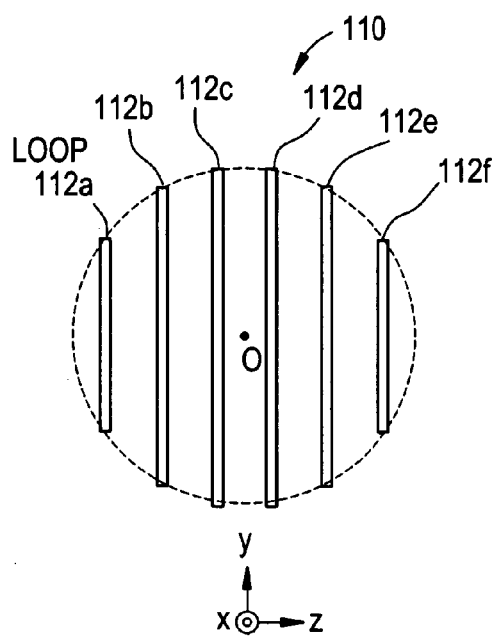

FIG. 2 schematically shows an exemplary configuration of the receive coil section 110. The coil is an example in the best mode for carrying out the present invention. The configuration of the coil represents an example of the RF coil in the best mode for carrying out the present invention.

In FIG. 2, the z-axis direction (body axis direction) coincides with the direction of a coil axis of the receive coil section 110, and the coil center is designated by a symbol O. FIG. 2(a) is a view in the z-axis direction, and (b) is a view in the x-axis direction. As shown, the receive coil section 110 comprises a plurality of loops 112a, 112b, 112c, 112d, 112e and 112f. While the number of loops is exemplified as six here, the number is not limited thereto and may be any plural number. Each loop constitutes an LC circuit. The resonance frequency of the LC circuit is the same among the loops. The resonance frequency is equal to the center frequency of magnetic resonance signals. Each loop is a solenoid coil. The solenoid coil is preferred in that the structure is simple.

The plurality of loops 112a–112f are concentric loops having a common coil axis, and are disposed along the coil axis at regular intervals. Each loop has a circular shape. Assuming a sphere concentric with the coil center O as indicated by a dashed line, the circles correspond to those formed by cutting the sphere vertically with respect to the coil axis at the positions of the loops. Thus, an envelope wrapping the plurality of loops 112a–112f forms a spherical shell. Moreover, there is formed inside the plurality of loops 112a–112f a spherical internal space. The internal space is sized to accommodate the head of the subject 1.

The intensity of a magnetic field generated by such a receive coil section 110 in its internal space is given by the following equation:

$$H = NI/3r,$$

wherein

N: the number of turns of the coil,

I: the current flowing through the coil, and r: the radius of the sphere.

Figure 3:
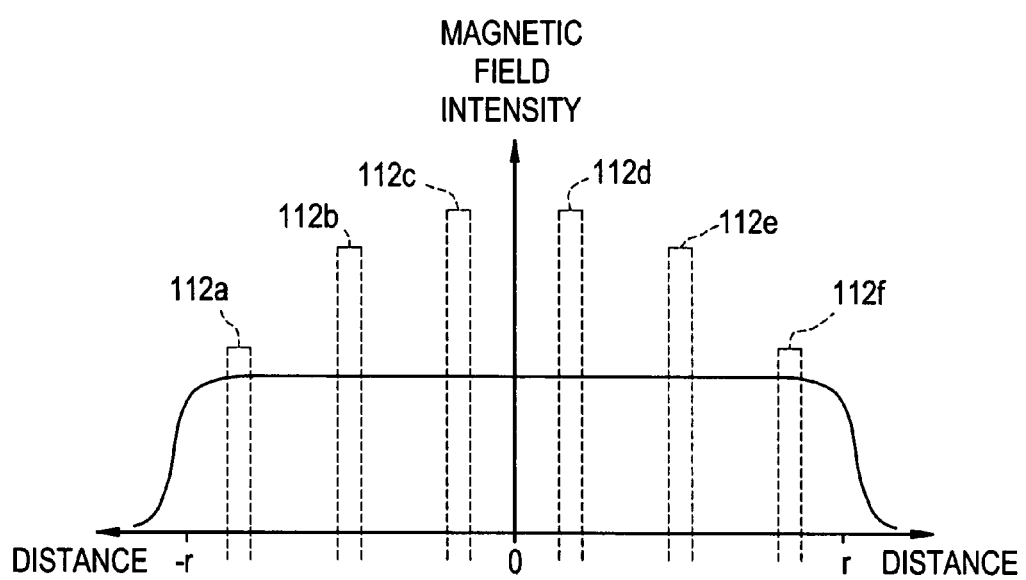
FIG. 3 is a diagram showing a magnetic field intensity distribution in the receive coil section.

FIG. 3 shows a distribution of the magnetic field intensity H along the coil axis. As shown, the magnetic field intensity is homogeneous over most of the length of the coil axis. The magnetic field intensity distribution corresponds to the sensitivity distribution of the receive coil section 110. Therefore, the receive coil section 110 has sensitivity that is homogeneous over most of the length of the coil axis. Since the sensitivity is thus prevented from dropping in the middle between the loops, an image reconstructed based on signals received by the receive coil section 110 has an SNR that is not reduced in the central portion.

Figure 4A:
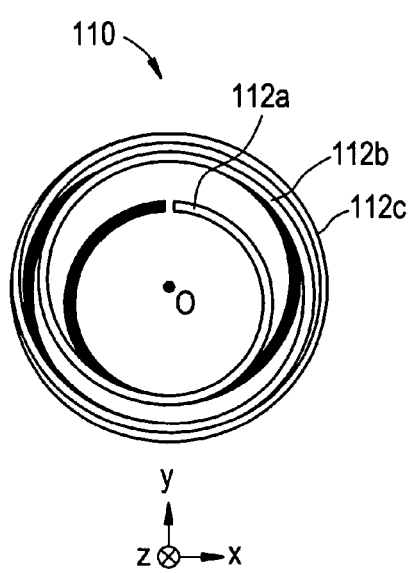
FIG. 4 is a diagram schematically showing the configuration of the receive coil section.
Figure 4B:
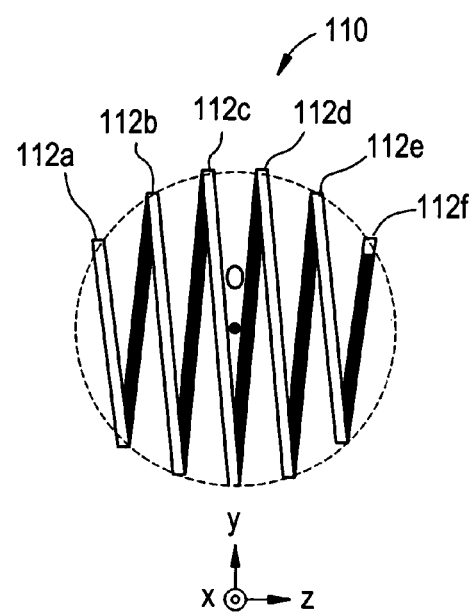

The loops 112a–112f may together form an uninterruptedly running helical loop (helical coil) as shown in FIG. 4. This can also provide a receive coil section 110 having a similar effect to that described above. In this case, since the loop uninterruptedly runs around the coil axis, homogeneity of the sensitivity distribution is further improved.

Figure 5A:
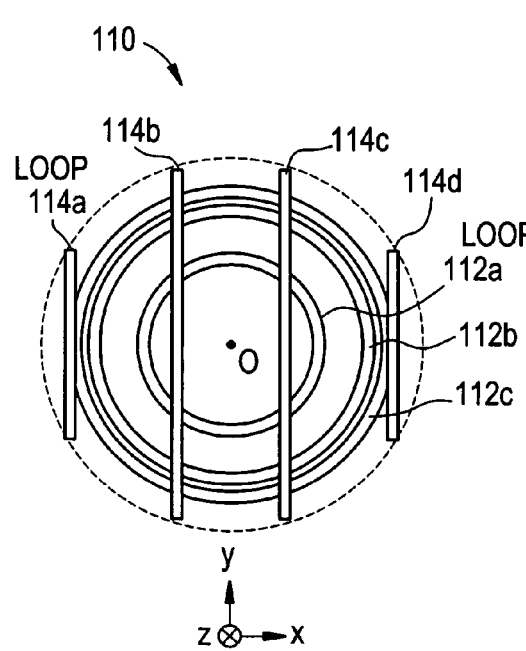
FIG. 5 is a diagram schematically showing the configuration of the receive coil section.
Figure 5B:
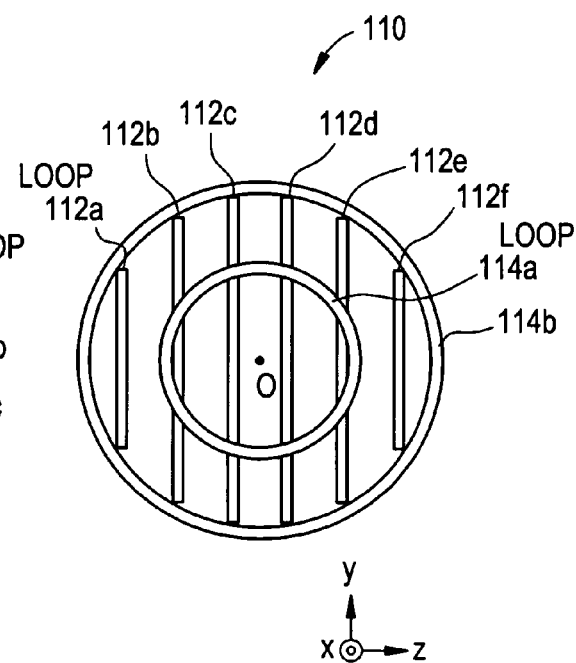

FIG. 5 schematically shows another exemplary configuration of the receive coil section 110. The coil is an example in the best mode for carrying out the present invention. The configuration of the coil represents an example of the RF coil in the best mode for carrying out the present invention. Similar portions in FIG. 5 to those shown in FIG. 2 are designated by similar reference symbols, and explanation thereof will be omitted.

As shown, the receive coil section 110 has a plurality of loops 114a, 114b, 114c and 114d having a coil axis coinciding with the x-axis. While the number of loops is exemplified as four here, the number is not limited thereto and may be any plural number. The loops 114a–114d are connected in series. Each loop constitutes an LC circuit. The resonance frequency of the LC circuit is the same among the loops, and is the same as that of the loops 112a–112f, for example. It is sufficient that the loops 114a–114d have an overall resonance frequency that is equal to the center frequency of magnetic resonance signals, and they are not required to have the same frequency. The same applies to the loops 112a–112f.

These loops 114a–114d are disposed along the coil axis (x-axis) at regular intervals. Each loop has a circular shape. Assuming a sphere concentric with the coil center O as indicated by a dashed line, the circles correspond to those formed by cutting the sphere vertically with respect to the coil axis at the positions of the loops. Thus, an envelope wrapping the plurality of loops 114a–114d forms a spherical shell. Moreover, there is formed inside the plurality of loops 114a–114d a spherical internal space. The internal space is sized to accommodate the loops 112a–112f.

The receive coil section 110 of such a structure has two orthogonal coil axes intersecting at the coil center O. The sensitivity distributions along the axes are each homogeneous. Having the two coil axes orthogonal to each other, the receive coil section 110 is capable of receiving RF signals (magnetic resonance signals) with phases different by 90°. Such an operation is generally referred to as a quadrature operation. The quadrature operation allows SNR to be further improved.

The receive coil section 110 having the two coil axes orthogonal to each other may be also constructed using the helical coil shown in FIG. 4. In this case, the quadrature operation by two sets of helical coils is enabled. Alternatively, it is possible to use the solenoid coil shown in FIG. 2 as one of the two sets and the helical coil shown in FIG. 4 as the other. This allows characteristics of both sets to be exploited.

Referring to FIG. 6, still another exemplary configuration of the receive coil section 110 is schematically shown. The coil is an example in the best mode for carrying out the present invention. The configuration of the coil represents an example of the RF coil in the best mode for carrying out the present invention. Similar portions in FIG. 6 to those shown in FIG. 2 are designated by similar reference symbols, and explanation thereof will be omitted.

As shown, the receive coil section 110 has two spiral coils 116a and 116b having the coil axis coinciding with the x-axis. The spiral coils 116a and 116b each constitute an LC circuit. The resonance frequency of the LC circuits is the same between the coils, and is also the same as that of the loops 112a–112f.

The two spiral coils 116a and 116b are disposed to face each other sandwiching the loops 112a–112f. The two spiral coils 116a and 116b thus disposed have higher sensitivity in the middle between the coils than two solenoid coils disposed at the same positions.

Figure 7:
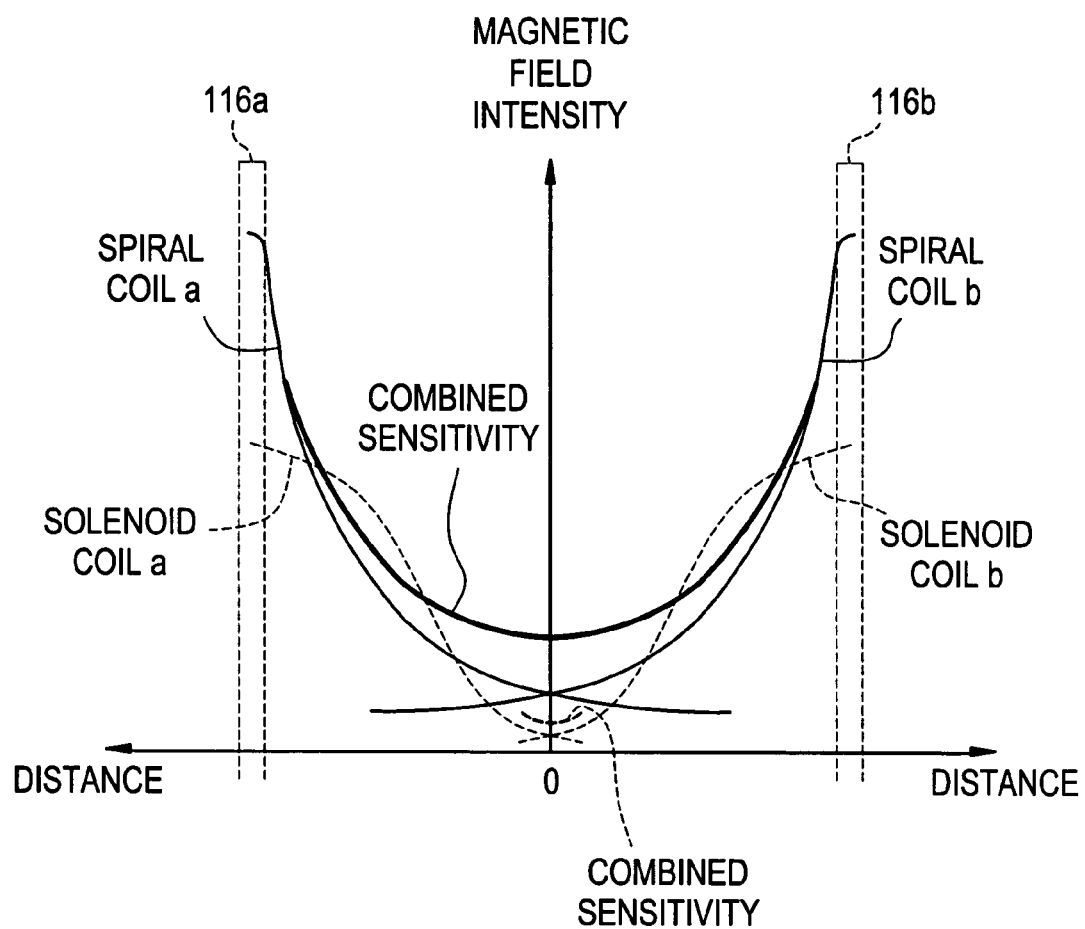
FIG. 7 is a diagram showing a magnetic field intensity distribution in the receive coil section.

Specifically, as shown in FIG. 7, the solenoid coils have respective sensitivities (magnetic field intensities) indicated by dashed lines, resulting in their combined sensitivity indicated by a bold dashed line; on the other hand, the spiral coils have respective sensitivities indicated by solid lines, and their combined sensitivity becomes as indicated by a bold solid line, thus providing higher sensitivity than the solenoid coils.

Thus, the receive coil section 110 comprising the spiral coils 116a and 116b has improved sensitivity at the coil center O. The spiral coils may be saddle coils 118a and 118b as shown in FIG. 8. The same effect can be obtained also in this case. Moreover, the two spiral coils may be connected in series to be used as a single unit as in conventional practice, or may be individually used as a phased array.

Figure 9A:
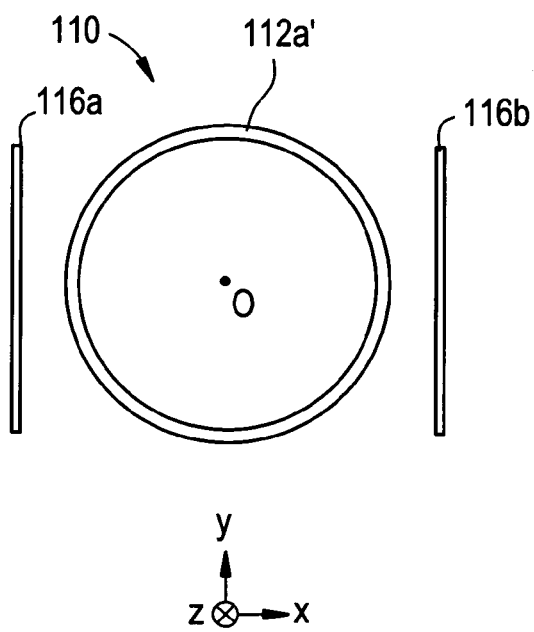
FIG. 9 is a diagram schematically showing the configuration of the receive coil section.
Figure 9B:
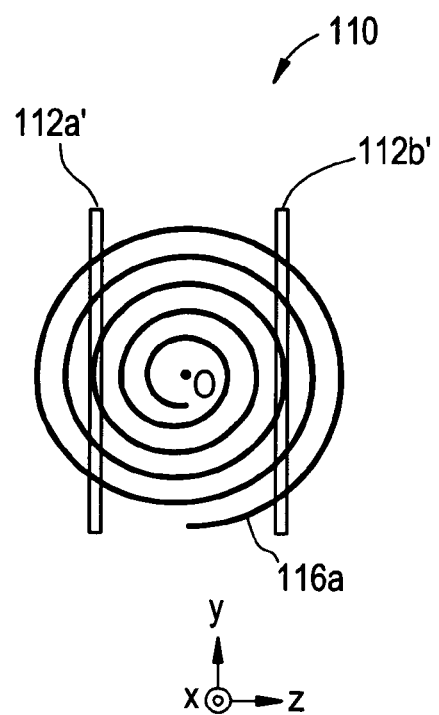

FIG. 9 schematically shows still another exemplary configuration of the receive coil section 110. The coil is an example in the best mode for carrying out the present invention. The configuration of the coil represents an example of the RF coil in the best mode for carrying out the present invention. Similar portions in FIG. 9 to those shown in FIG. 6 are designated by similar reference symbols, and explanation thereof will be omitted.

As shown, the receive coil section 110 has two loops 112a' and 112b' having the coil axis coinciding with the z-axis. The loops 112a' and 112b' each constitute an LC circuit. The resonance frequency of the LC circuits is the same between the coils, and is also the same as that of the spiral coils 116a and 116b.

The two loops 112a' and 112b' are disposed in a space sandwiched by the spiral coils 116a and 116b. The two loops 112a' and 112b' are each a solenoid coil. Although the loops 112a' and 112b' have lower sensitivity at the coil center as shown in FIG. 7, the spiral coils 116a and 116b have higher sensitivity there as shown in FIG. 7, and combined sensitivity at the coil center is improved.

Figure 10A:
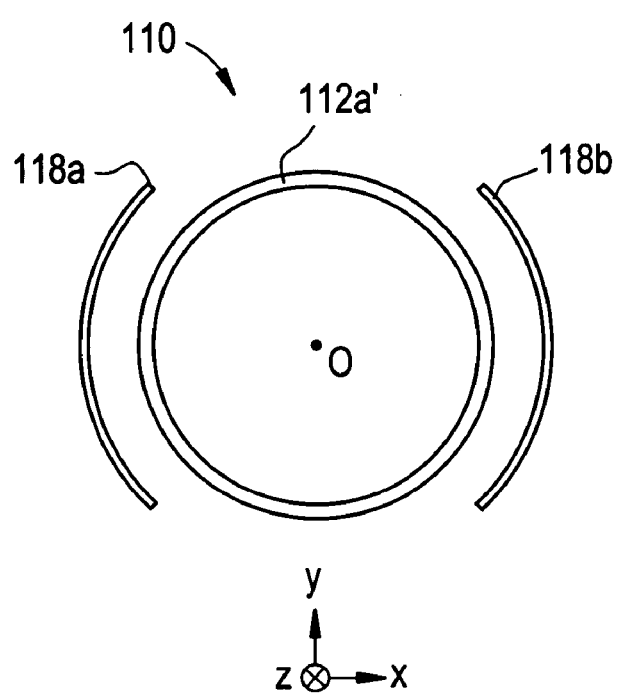
FIG. 10 is a diagram schematically showing the configuration of the receive coil section.
Figure 10B:
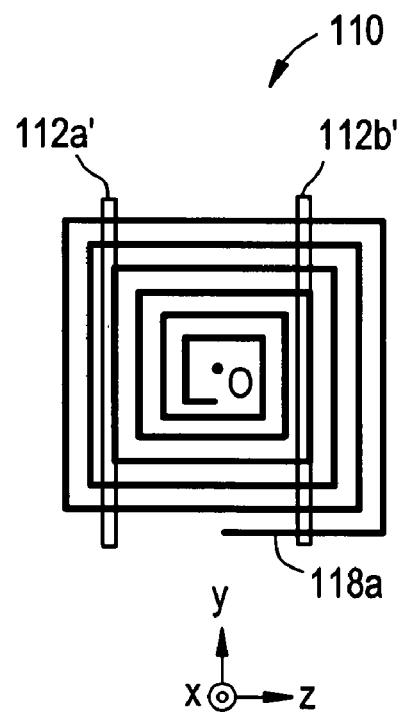

The spiral coils may be saddle coils 118a and 118b as shown in FIG. 10. This yields the same effect. Moreover, the two spiral coils may be connected in series to be used as a single unit as in conventional practice, or may be individually used as a phased array.

Figure 11:
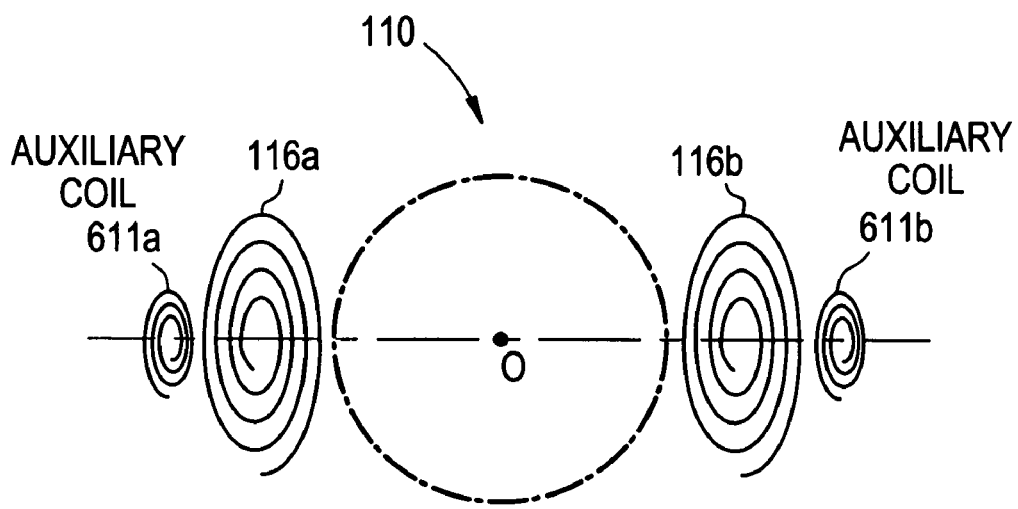
FIG. 11 is a diagram schematically showing the configuration of the receive coil section.

Furthermore, the spiral coils 116a and 116b may be attached with auxiliary coils 611a and 611b as shown in FIG. 11. The auxiliary coils 611a and 611b are also spiral coils. The auxiliary coils 611a and 611b are concentrically disposed near the spiral coils 116a and 116b. In a space sandwiched by the spiral coils 116a and 116b, the aforesaid loops 112a–112f or loops 112a' and 112b' are disposed. These coils are represented by a dot-dash circle.

The auxiliary coils 611a and 611b have an inverse electromagnetic effect with respect to the spiral coils 116a and 116b. Such coils may be made by inverting the direction of their spirals, for example. Alternatively, the coils may be made by inverse connection.

Figure 12:
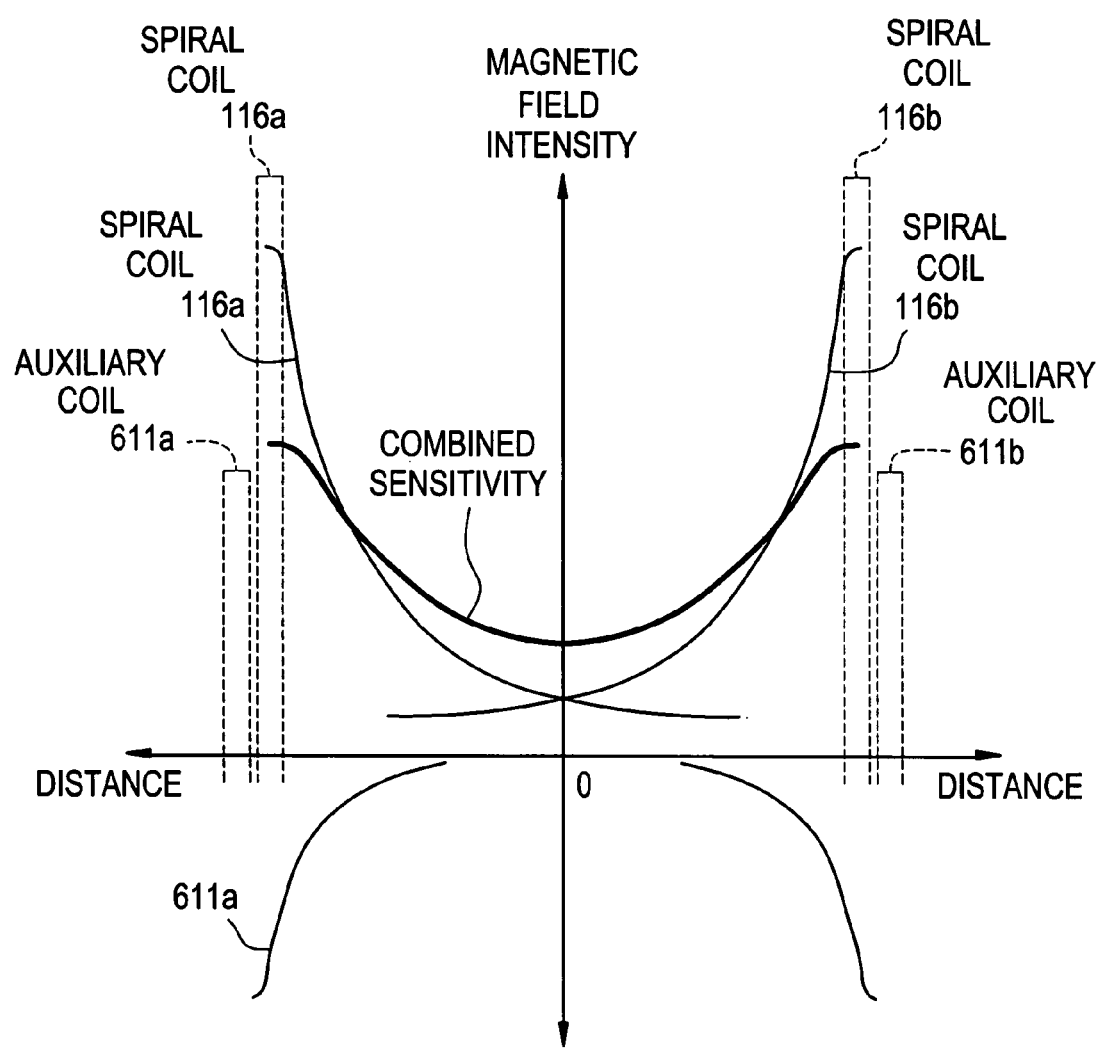
FIG. 12 is a diagram showing a magnetic field intensity distribution in the receive coil section.

A spiral coil has a property that its sensitivity steeply rises at the coil position. This causes sensitivity along the coil axis to vary widely, and a differential effect given by the auxiliary coils 611a and 611b having an inverse electromagnetic effect mitigates the steep rise in sensitivity at the coil position as shown in FIG. 12.

The degree of the differential effect is adjusted by the distance, coil area, number of coil turns and the like of the auxiliary coils 611a and 611b relative to the spiral coils 116a and 116b. The differential effect increases for a smaller distance, larger coil area, and a larger number of coil turns, and decreases for a larger distance, smaller coil area, and a smaller number of coil turns. The saddle coils shown in FIG. 8 or 10 may be provided with similar auxiliary coils.

Figure 13:
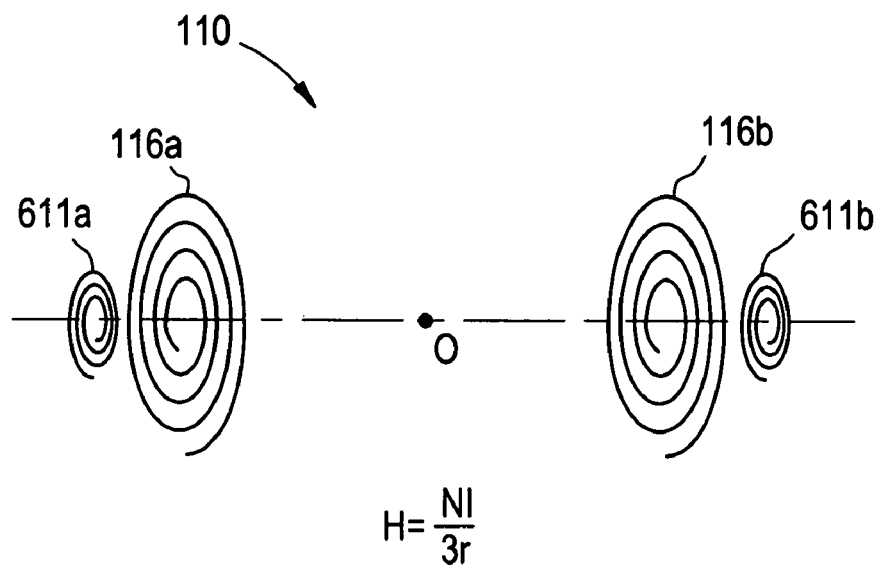
FIG. 13 is a diagram schematically showing the configuration of the receive coil section.

The spiral coils 116a and 116b provided with such auxiliary coils 611a and 611b may be used alone as shown in FIG. 13 instead of being combined with a plurality of loops, which is an example of the receive coil section 110 in the best mode for carrying out the present invention. The spiral coils 116a and 116b having such auxiliary coils 611a and 611b may be used as a phased array.

The receive coil section 110 having the aforementioned configuration may be used not only in receiving RF signals but in transmitting or transmitting/receiving RF signals. Therefore, the RF coil of the present invention is not limited to that dedicated to signal reception.

Many widely different embodiments of the invention may be configured without departing from the spirit and the scope of the present invention. It should be understood that the present invention is not limited to the specific embodiments described in the specification, except as defined in the appended claims.

The invention claimed is:

1. An RF coil comprising:
   a plurality of concentric loops lying at different positions along a coil axis at regular intervals,
   wherein said loops are circular loops whose circles correspond to those formed by cutting a sphere common to said loops vertically with respect to the coil axis at the different positions along the coil axis, wherein a first one of said loops is parallel to a second one of said loops, wherein a resonance frequency of said loops is equal to a center frequency of a plurality of magnetic resonance signals generated by a plurality of spins excited within a subject.

2. The RF coil of claim 1, wherein each of said plurality of loops forms a solenoid coil.

3. The RF coil of claim 1, wherein said loops together form a helical coil uninterruptedly running around the coil axis.

4. The RF coil of claim 1, wherein said coil axis comprises two orthogonal axes intersecting at a center of the common sphere, and said plurality of loops comprises two sets of loops disposed one along each axis.

5. The RF coil of claim 4, wherein one of said two sets has said plurality of loops individually forming solenoid coils, and the other has said plurality of loops forming a helical coil uninterruptedly running around the coil axis.

6. The RF coil of claim 1, further comprising:
   a spiral coil having a coil axis orthogonally intersecting said coil axis at the center of said common sphere, and disposed outside said plurality of loops.

7. An RF coil comprising:
   a plurality of concentric loops lying at different positions along a first coil axis; and
   a spiral coil having a second coil axis orthogonally intersecting said first coil axis at a center thereof, and disposed outside said plurality of loops, wherein a resonance frequency of one of said plurality of loops is equal to a center frequency of a plurality of magnetic resonance signals generated by a plurality of spins excited within a subject.

8. An RF coil of claim 7, wherein said plurality of loops has an internal space for accommodating a head of a medical patient.

9. The RF coil of claim 7, wherein said spiral coil has an auxiliary spiral coil having an inverse electromagnetic effect.

10. The RF coil of claim 7, wherein said spiral coil is comprised of a pair of coils having a common coil axis and disposed to face each other.

11. An RF coil comprising:
    a pair of main spiral coils having a common coil axis and disposed to face each other; and
    a pair of auxiliary spiral coils attached to said pair of main spiral coils, and having an inverse electromagnetic effect, wherein a resonance frequency of one of said main spiral coils is equal to a center frequency of a plurality of magnetic resonance signals generated by a plurality of spins excited within a subject.

12. The RF coil of claim 11, wherein said pair of main spiral coils form a phased array coil.

13. The RF coil of claim 11, wherein said pair of main spiral coils form a saddle coil.

14. The RF coil of claim 11, wherein said auxiliary coils have a direction of their spirals inverted with respect to said main spiral coils.

15. The RF coil of claim 11, wherein said auxiliary coils have a smaller area than that of said main spiral coils.

16. The RF coil of claim 11, wherein said auxiliary coils have a smaller number of turns than that of said main spiral coils.

17. An MRI apparatus for applying a static magnetic field, a gradient magnetic field and a high frequency magnetic field by a magnet system, receiving magnetic resonance signals generated thereby within a subject by an RF coil, and reconstructing an image based on the received signals, wherein said RF coil comprises:
    a plurality of concentric loops lying at different positions along a coil axis at regular intervals,
    wherein said loops are circular loops whose circles correspond to those formed by cutting a sphere common to said loops vertically with respect to the coil axis at the different positions along the coil axis, wherein a first one of said loops is parallel to a second one of said loops, wherein a resonance frequency of said loops is equal to a center frequency of a plurality of magnetic resonance signals generated by a plurality of spins excited within a subject.

18. An MRI apparatus for applying a static magnetic field, a gradient magnetic field and a high frequency magnetic field by a magnet system, receiving magnetic resonance signals generated thereby within a subject by an RF coil, and reconstructing an image based on the received signals, wherein said RF coil comprises:
    a plurality of concentric loops lying at different positions along a first coil axis; and
    a spiral coil having a second coil axis orthogonally intersecting said first coil axis at a center thereof, and disposed outside said plurality of loops, wherein a resonance frequency of one of said plurality of loops is equal to a center frequency of a plurality of magnetic resonance signals generated by a plurality of spins excited within a subject.

19. An MRI apparatus for applying a static magnetic field, a gradient magnetic field and a high frequency magnetic field by a magnet system, receiving magnetic resonance signals generated thereby within a subject by an RF coil, and reconstructing an image based on the received signals, wherein said RF coil comprises:
    a pair of main spiral coils having a common coil axis and disposed to face each other; and
    a pair of auxiliary spiral coils attached to said pair of main spiral coils, and having an inverse electromagnetic effect, wherein a resonance frequency of one of said main spiral coils is equal to a center frequency of a plurality of magnetic resonance signals generated by a plurality of spins excited within a subject.

20. An RF coil of claim 7, wherein a plane of said spiral coil is perpendicular to a plane of the first one of said plurality of loops.

* * * * *

UNITED STATES PATENT AND TRADEMARK OFFICE
CERTIFICATE OF CORRECTION

PATENT NO. : 7,176,688 B2 Page 1 of 1
APPLICATION NO. : 10/968545
DATED : February 13, 2007
INVENTOR(S) : Sato It is certified that error appears in the above-identified patent and that said Letters Patent is hereby corrected as shown below:

In Claim 1, column 8, line 47, delete "reasonance" and insert therefor -- resonance --.

Signed and Sealed this

Sixth Day of November, 2007

JON W. DUDAS
*Director of the United States Patent and Trademark Office*